(12) United States Patent
Paillet et al.

(10) Patent No.: US 9,213,382 B2
(45) Date of Patent: Dec. 15, 2015

(54) LINEAR VOLTAGE REGULATOR BASED ON-DIE GRID

(75) Inventors: Fabrice Paillet, Hillsboro, OR (US); Joseph Shor, Yakum, IL (US); George L. Geannopoulos, Portland, OR (US); Hong Yun Tan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/612,239

(22) Filed: Sep. 12, 2012

(65) Prior Publication Data

US 2014/0070876 A1     Mar. 13, 2014

(51) Int. Cl.
    *G05F 1/10*            (2006.01)
    *G05F 3/02*            (2006.01)
    *G06F 1/26*            (2006.01)

(52) U.S. Cl.
    CPC ........................................ *G06F 1/26* (2013.01)

(58) Field of Classification Search
    CPC ........... G05F 3/262; G05F 3/265; G05F 3/30; G05F 3/205; G11C 5/147
    USPC ........... 327/538, 540, 541, 543; 323/269, 274
    See application file for complete search history.

(56) References Cited

U.S. PATENT DOCUMENTS

| | | | |
|---|---|---|---|
| 5,512,814 A | | 4/1996 | Allman |
| 6,838,927 B2 | * | 1/2005 | Oonishi ........................ 327/534 |
| 7,068,018 B2 | | 6/2006 | Kanakubo |
| 7,119,606 B2 | * | 10/2006 | Fahim ........................... 327/541 |
| 7,362,079 B1 | * | 4/2008 | Maheedhar et al. .......... 323/269 |
| 7,504,808 B2 | | 3/2009 | Schrom et al. |
| 7,528,619 B2 | | 5/2009 | Paillet et al. |
| 7,541,786 B2 | | 6/2009 | Yen |
| 7,564,299 B2 | | 7/2009 | Shor et al. |
| 7,593,281 B2 | * | 9/2009 | Pyeon et al. ................. 365/226 |
| 7,646,108 B2 | | 1/2010 | Paillet et al. |
| 7,728,688 B2 | | 6/2010 | Shor |
| 7,750,611 B2 | * | 7/2010 | Lee ............................... 323/274 |
| 7,973,518 B2 | | 7/2011 | Shor et al. |
| 2002/0014914 A1 | * | 2/2002 | Perque et al. ................. 327/543 |
| 2005/0046396 A1 | | 3/2005 | Patterson |
| 2007/0139101 A1 | * | 6/2007 | Wang et al. .................. 327/540 |
| 2009/0079406 A1 | | 3/2009 | Deng et al. |
| 2009/0085534 A1 | | 4/2009 | Ko et al. |
| 2009/0167421 A1 | * | 7/2009 | Hirobe .......................... 327/541 |
| 2009/0302815 A1 | | 12/2009 | Tanzawa |
| 2010/0085786 A1 | * | 4/2010 | Chiu et al. ...................... 363/59 |
| 2010/0109435 A1 | | 5/2010 | Ahmadi et al. |
| 2010/0321647 A1 | * | 12/2010 | Schuler et al. ................ 353/121 |
| 2011/0285456 A1 | * | 11/2011 | Thornton et al. ............. 327/541 |

FOREIGN PATENT DOCUMENTS

TW      2008-30082      7/2008

OTHER PUBLICATIONS

Hazucha, P. et al., "Area-Efficient Linear Regulator with Ultra-Fast Load Regulation", IEEE Journal of Solid-State Circuits, vol. 40, No. 4, Apr. 2005, pp. 933-940 (8 pages).
Notification of Transmittal of the International Search Report and the Written Opinion of the International Searching Authority isssued in International Patent Application No. PCT/US2013/045240, mailed Nov. 19, 2013, 12 pages.
First Notification for Rectification issued for Chinese Patent Application No. 201320703994.4, mailed Jan. 15, 2014, 5 pages.
Notice of Allowance for Chinese Patent Application No. 20130703994.4, mailed Apr. 11, 2014, 4 pages.

* cited by examiner

*Primary Examiner* — Quan Tra
(74) *Attorney, Agent, or Firm* — Blakely, Sokoloff, Taylor & Zafman LLP

(57) ABSTRACT

Described is a linear voltage regulator circuit comprising a first voltage regulator comprising a first source follower having a first node to provide a first power supply, and a second node different from the first node; and a second voltage regulator comprising a second source follower having a first node to provide a second power supply, and a second node different from the first node, wherein the second nodes of the first and second voltage regulators are electrically shorted.

15 Claims, 8 Drawing Sheets

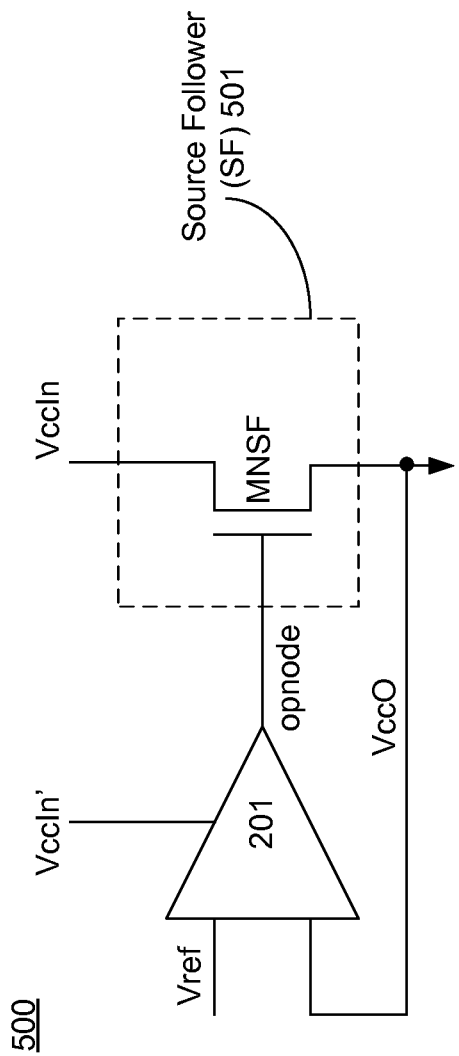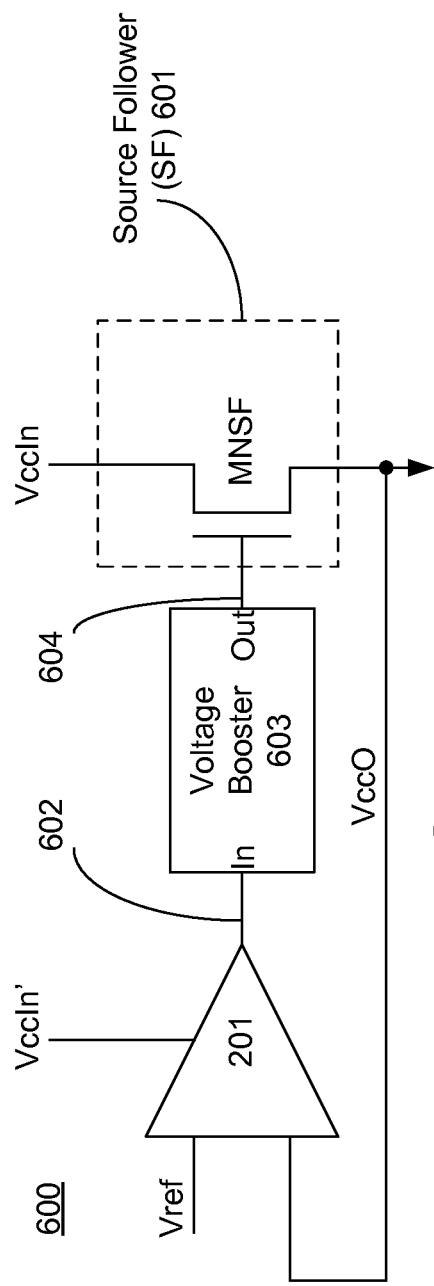

LINEAR VOLTAGE REGULATOR BASED ON-DIE GRID

BACKGROUND

Voltage regulator(s) (VRs) are used for providing regulated power supply to a load. As VRs are integrated on a processor, providing regulated power supply to various parts of the processor becomes a challenge. For example, when there are no primary voltage supplies available to power the circuits of the processor (e.g., when the processor wakes up) an auxiliary internally generated power supply may be needed to wake up various circuits on the processor. However, such locally generated power supply when distributed globally across the processor to power various circuits may suffer from dynamic voltage droops that may cause speed path or timing failure in various circuits of the processor.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 is a VR which is distributed on the on-die grid, according to one embodiment of the disclosure.

FIG. 6 is a VR with a voltage booster, according to one embodiment of the disclosure.

DETAILED DESCRIPTION

Figure 1:
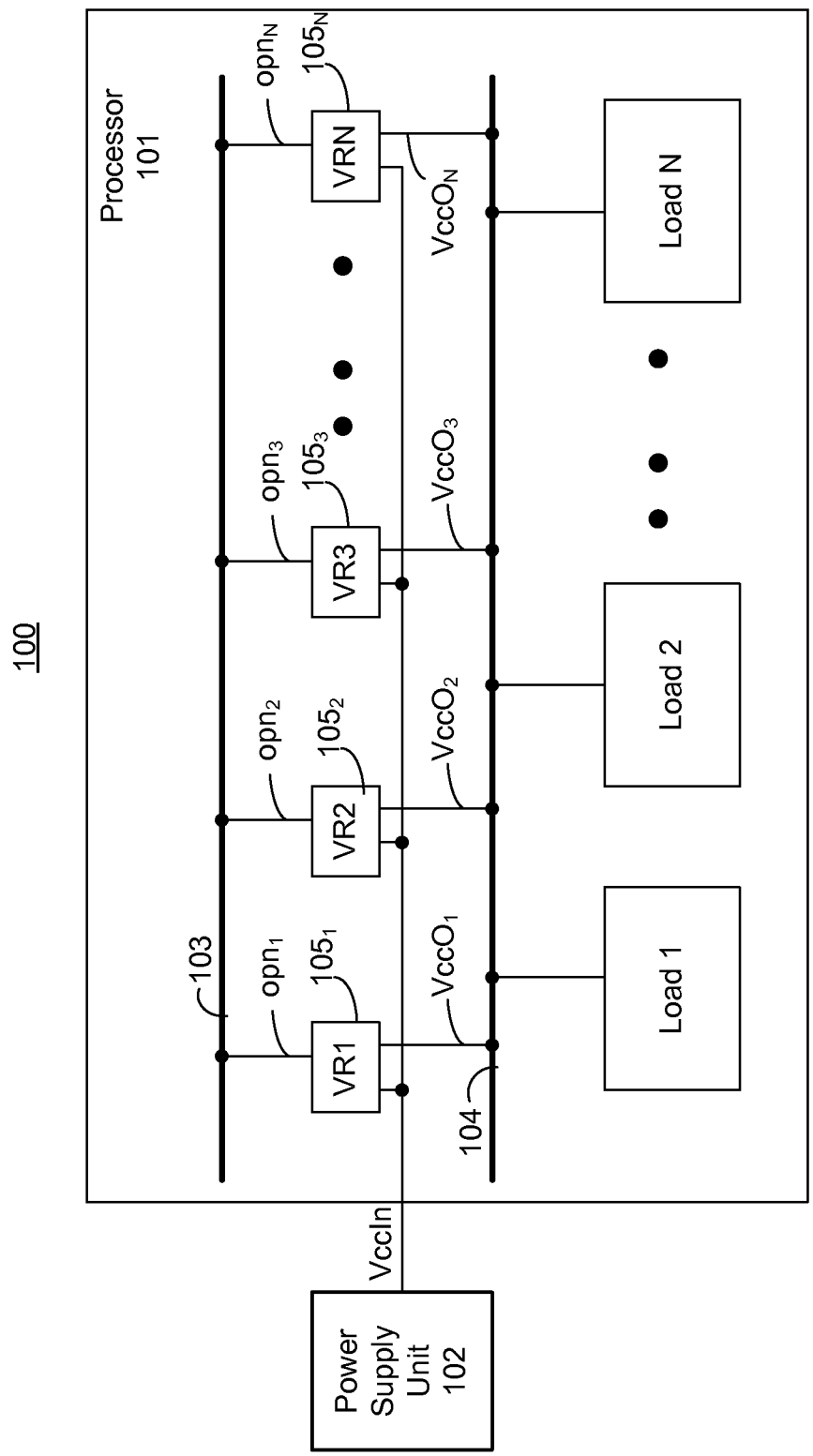
FIG. 1 is a system with a processor having integrated voltage regulators (VRs) distributed on an on-die metal grid, according to one embodiment of the disclosure.

When a power supply is distributed across the processor to power various circuits, the power supply may suffer from dynamic voltage droops that may cause speed path or timing failure for various circuits. The dynamic voltage droop may be caused by some circuits demanding more power at startup than others, causing an entire grid of the power supply to experience a voltage droop. Such voltage droop may cause timing failures for circuits in the processor.

In the embodiments discussed herein a distributed linear voltage regulator (LVR) network provides power supply across the processor to multiple loads. A non-limiting analogy of the distributed LVR network is a suspension bridge where LVRs distributed across the processor behave like the steel cable tower holding the bridge deck suspended in the air. In this analogy, the LVR in the network maintains a level of voltage on the power grid just as the steel cables maintain the level of the bridge relative to the ground. In this analogy, the distance between two LVRs is determined such that the voltage on the power grid (having the distributed LVRs coupled to it) does not sag beyond an acceptable range set by circuit performance validation requirements. For example, the vertical steel cables coupled to the bridge road are separated by a distance such that when a car passes the road across the steel cables, the steel cables maintain the level of the road i.e., the tension in the steel cables does not allow the road to sag when a car passes on that road.

In one embodiment, the LVRs distributed across the processor which provide power to the power grid work in unity. For example, due to the variations in voltage across the power grid and native random offset in the LVR circuits distributed across the processor, an LVR among the distributed LVRs may experience voltages on its output node that are higher than what that LVR is targeted to deliver, hence turning itself off i.e., not working in unity with other LVRs that are turned on and providing power. When such an LVR turns itself off, a dramatic impact may be experienced in the Alternating Current (AC) response of the power grid. For example, dynamic voltage droops at some location on the power grid may exceed the acceptable voltage range and create speed path or timing failure for circuits receiving that drooped voltage power supply.

In one embodiment, a source follower based LVR circuit topology is used for the distributed LVR network. In one embodiment, the source follower based LVR circuit provides high-current efficiency and low quiescent current with good load regulation.

The term "efficiency" herein refers to the ratio of output power to input power of the voltage regulator. An efficiency of '1' is higher than an efficiency of '0.7,' for example. The term "efficiency" may also refer to "current efficiency" which is a ratio of current delivered to the load divided by current consumed. In some embodiments, 99% or higher current efficiency is achievable with the source follower based LVR topology while retaining good load regulation and PSRR (power supply rejection ratio). Power efficiency of an LVR is typically determined by the ratio of input voltage to output voltage.

In one embodiment, the output nodes of the LVRs in the distributed LVR network are electrically shorted i.e., the power grid that is coupled to the outputs of the LVRs is a shorted power grid. In one embodiment, the node coupled to the gate of the source follower of the LVR is shorted with another similar node coupled to the gate of another source follower. This node herein is also referred to as the "opout" node or "opnode."

In one embodiment, "opout" node corresponds to the output of the amplifier of the LVR driving the gate of the source follower output stage of the LVR. In one embodiment, the source follower is an n-type source follower. For example, the source follower comprises an NMOS transistor with its gate coupled to the "opout" node, its drain terminal coupled to the input power supply (e.g., power supply received from another source). In other embodiments, a p-type source follower may be used.

The technical effects of the embodiments of the disclosure are many. For example, the embodiments herein prevent LVRs in the distributed LVT network from shutdown because of offset and grid sagging (voltage drooping on various parts of the grid). The embodiments herein reduces Direct Current (DC) offset and allow addition of power delivery resources where needed by hooking up output stage transistors to the distributed "opout" node. Other technical effects will be evident from various embodiments discussed herein The term "power domain" herein generally refers to logic areas in an integrated circuit (IC) chip that receive a specific power supply. Different logic areas in the IC chip may operate on different power supplies. Such logic areas are referred to as power domains. For example, the input-output (I/Os) of the IC chip may operate at a different power supply than the processing core of the IC chip, where the I/O and the processing core form two different power domains. In one embodiment, different power domains have different distributed LVR power grids.

The terms "substantially," "close," "approximately," herein refer to being within +/−20% of a target value.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and the include plural references. The meaning of "in" includes "in" and "on."

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1 is a system 100 with a processor 101 having integrated voltage regulators (VRs) $105_{1-N}$, where 'N' is a positive integer, distributed on an on-die metal grid 104, according to one embodiment of the disclosure.

In one embodiment, the system 100 comprises a power supply unit 102 to provide an input power supply VccIn. In one embodiment, the power supply unit 102 is a battery. For example, the power supply unit 102 is a rechargeable battery. In another embodiment, the power supply unit 102 is an external source of power. In one embodiment, the power supply unit 102 is positioned in the same package as the processor 101. In other embodiments, the power supply unit 102 is external to the package of the processor 101. In one embodiment, the power supply unit 102 is integrated within the die of the processor 101.

In one embodiment, the processor 101 comprises a network of distributed VRs $105_{1-N}$ to provide power supplies $VccO_{1-N}$ to the power supply grid 104. In one embodiment, the power supply grid 104 provides power to one or more loads 1-N, where 'N' is an integer. In one embodiment, internal nodes $opn_{1-N}$ (i.e., "opnodes" or "opouts") of the VRs $105_{1-N}$ are electrically shorted together. For example, the internal nodes $opn_{1-N}$ are electrically shorted via metal/conducting layer 103. In one embodiment, the voltage regulators $105_{1-N}$ are linear voltage regulators (LVRs). In one embodiment, the voltage regulators $105_{1-N}$ are linear are low drop out regulators.

Figure 2:
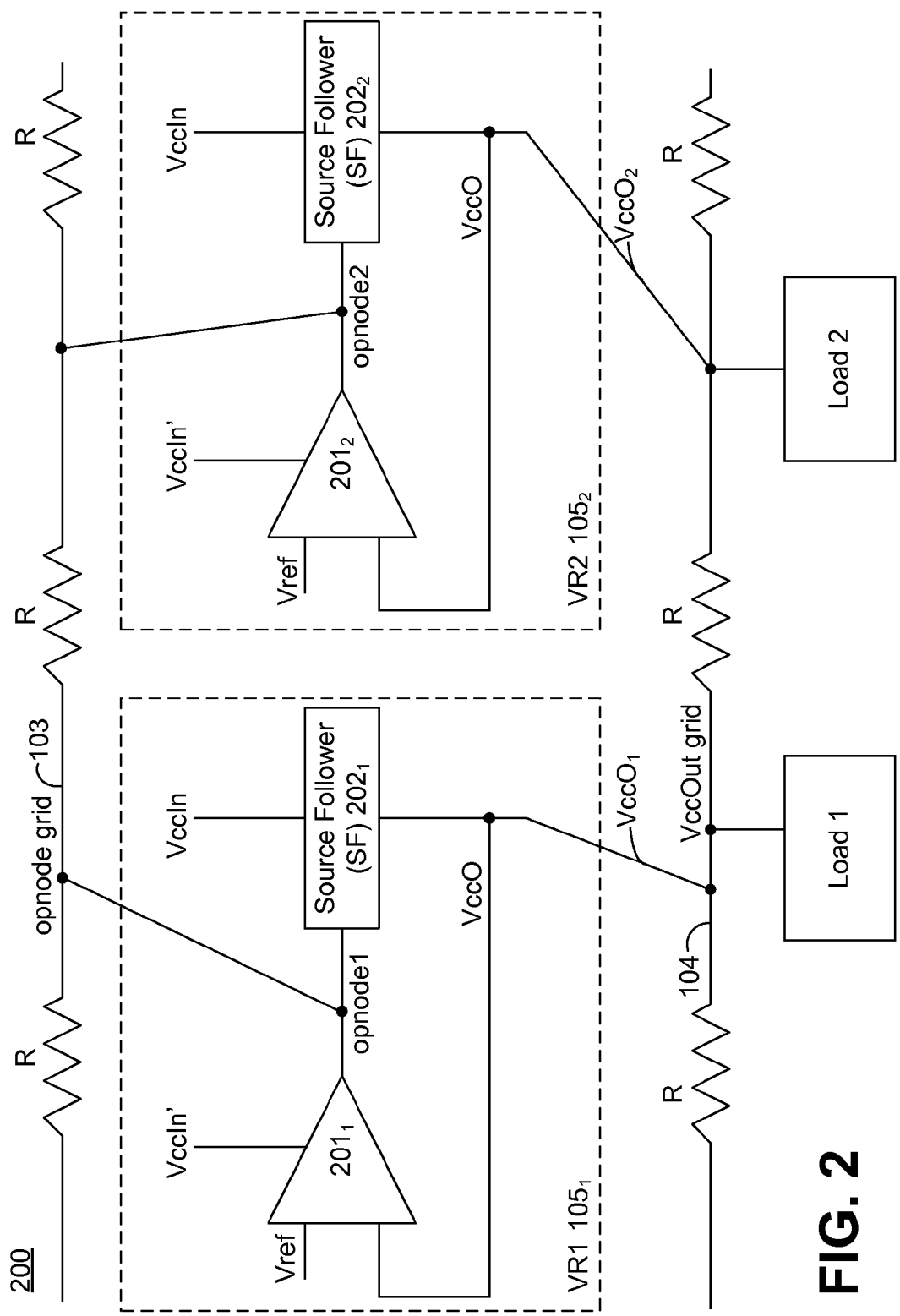
FIG. 2 is a part of the on-die grid with distributed VRs, according to one embodiment of the disclosure.

FIG. 2 is a part of the on-die grid 200 with distributed VRs, according to one embodiment of the disclosure. FIG. 2 is described with reference to FIG. 1. In this example, two VRs $105_1$ and $105_2$ are illustrated. The embodiment is applicable to any number of VRs. So as not to obscure the embodiments, VR1 $105_1$ is discussed. The same discussion is applicable to VR2 $105_2$ and other VRs.

In one embodiment, the VR1 $105_1$ comprises an amplifier $201_1$ coupled to a source follower (SF) $202_1$. In one embodiment, the amplifier $201_1$ is a differential amplifier which is electrically coupled to the SF $202_1$ in a feedback mode, where the amplifier $201_1$ receives a reference voltage Vref and the feedback signal VccO from the SF $202_1$. In one embodiment, the SF $202_1$ comprises an n-type device with its gate terminal coupled to opnode1, source terminal coupled to VccO, and drain terminal coupled to VccIn. In other embodiments, other SF circuits may be used that receive a controlling input signal opnode1 and generate a power supply VccO which is used as a feedback for the amplifier $201_1$.

In one embodiment, the amplifier $201_1$ is a differential amplifier. In one embodiment, the amplifier $201_1$ is a single stage amplifier. In other embodiments, multiple stages may be used for the amplifier $201_1$.

In one embodiment, Vref is generated within the VR1 $105_1$. In other embodiments, Vref is generated external to the VR1 $105_1$. In one embodiment, Vref is generated by a bandgap circuit. Any known reference generator may be used to generate Vref. In one embodiment, Vref is generated by a single source and is supplied or distributed to other VRs. In other embodiments, several VRs share the same Vref i.e., one Vref generator for a set of VRs and another Vref generator for another set of VRs.

In one embodiment, the output opnode1 of the amplifier $201_1$ controls the gate of the SF $202_1$ to cause its output VccO to be substantially equal to Vref. In one embodiment, the amplifier $201_1$ and the SF $202_1$ operate on the same power supply VccIn from the power supply unit 102. In another embodiment, the amplifier $201_1$ and the SF $202_1$ operate with different power supplies VccIn' and VccIn, respectively. In one embodiment, VccIn' is a filtered power supply which is generated by filtering VccIn. In another embodiment, VccIn' and VccIn are unrelated power supplies with substantially equal power supply levels.

In one embodiment, the output opnode1 of the amplifier $201_1$ is electrically shorted with the output opnode2 generated by amplifier $201_2$ of VR2 $201_2$, where opnode2 controls the input of the SF $202_2$. In one embodiment, the output opnode1 of the amplifier $201_1$ is electrically shorted with the output opnode2 generated by amplifier $201_2$ via an opnode grid 103. The resistors 'R' in the opnode grid 103 represent a resistive grid. A substantially un-resistive grid may also be used.

In one embodiment, the outputs $VccO_1$ and $VccO_2$ of the SFs $202_1$ and $202_2$, respectively, are electrically shorted through the power grid 104, which provide power supply to multiple loads (e.g., Load 1 and Load 2).

In one embodiment, the amplifier $201_1$ is a single stage amplifier which is operable to drive the SF $202_2$. In this embodiment, opnode1 provides the dominant pole to the VR. The output node VccO is a low impedance node, since it is driven by the SF $202_2$. In this embodiment, there is a single dominant pole, set by the opnode1 node, making this VR circuit topology stable. In one embodiment, sharing the opnode as well as the output node VccO between multiple LVRs make all of these LVR instances behave as a single LVR from an analog perspective (i.e., behaving as a single analog control loop) providing power to multiple loads.

In one embodiment, VccOut 104 serves as a digital power supply. The voltage droop of this digital supply may be dominated by the resistance of the VccOut on-die metal grid 104, and not by the LVR circuits themselves. One of the many advantages of this configuration is that no package resources or bumps may be required. For example, only die-level metals may be used. In one embodiment, the amplifiers $201_{1-N}$ and SF $202_{1-N}$ may use the VccIn package bumps, which are the input supply voltages of an on-die or off-die voltage regulator. In multi-core chips, bumps are generally scarce, so the re-use of VccIn bumps may provide an advantage in this topology by allowing a distributed LVR grid topology.

Figure 3:
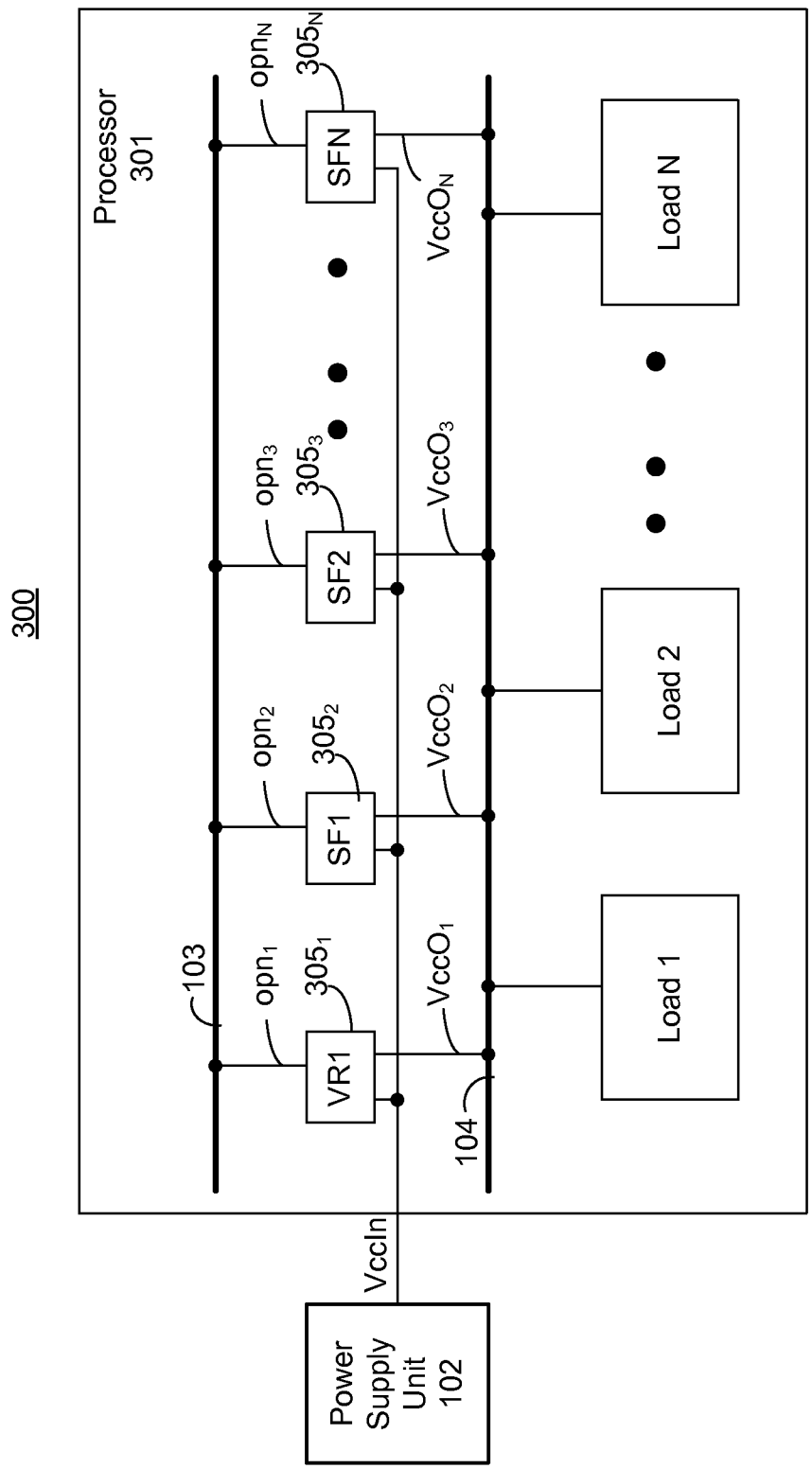
FIG. 3 is a system with a processor having integrated VRs and source followers distributed on an on-die metal grid, according to one embodiment of the disclosure.

FIG. 3 is a system 300 with a processor 301 having integrated VRs and source followers distributed on an on-die metal grid, according to one embodiment of the disclosure. The embodiment of FIG. 3 is similar to the embodiment of FIG. 1. So, as not to obscure the embodiments of FIG. 3, the differences between system 100 and system 300 are discussed and other circuits previously discussed are not repeated in the discussion.

In this embodiment, a single VR1 $305_1$ is coupled with a distributed network of SFs $305_{2-N}$. In one embodiment, the output $opn_1$ of the amplifier of the VR1 $305_1$ is electrically shorted with the gates (which are coupled to $opn_{2-N}$) of the SFs $305_{2-N}$. In this embodiment, power consumption associated with the grid is reduced because the number of VRs is reduced i.e., fewer number of amplifiers associated with the power grid.

While the embodiment of FIG. 3 illustrates a single VR1 $305_1$ coupled to many source followers, multiple VRs may be used so that each VR shares an opnode with all the other source followers and other VRs. In one embodiment, the architectures of FIG. 1 and FIG. 3 may be combined within a single processor.

Figure 4:
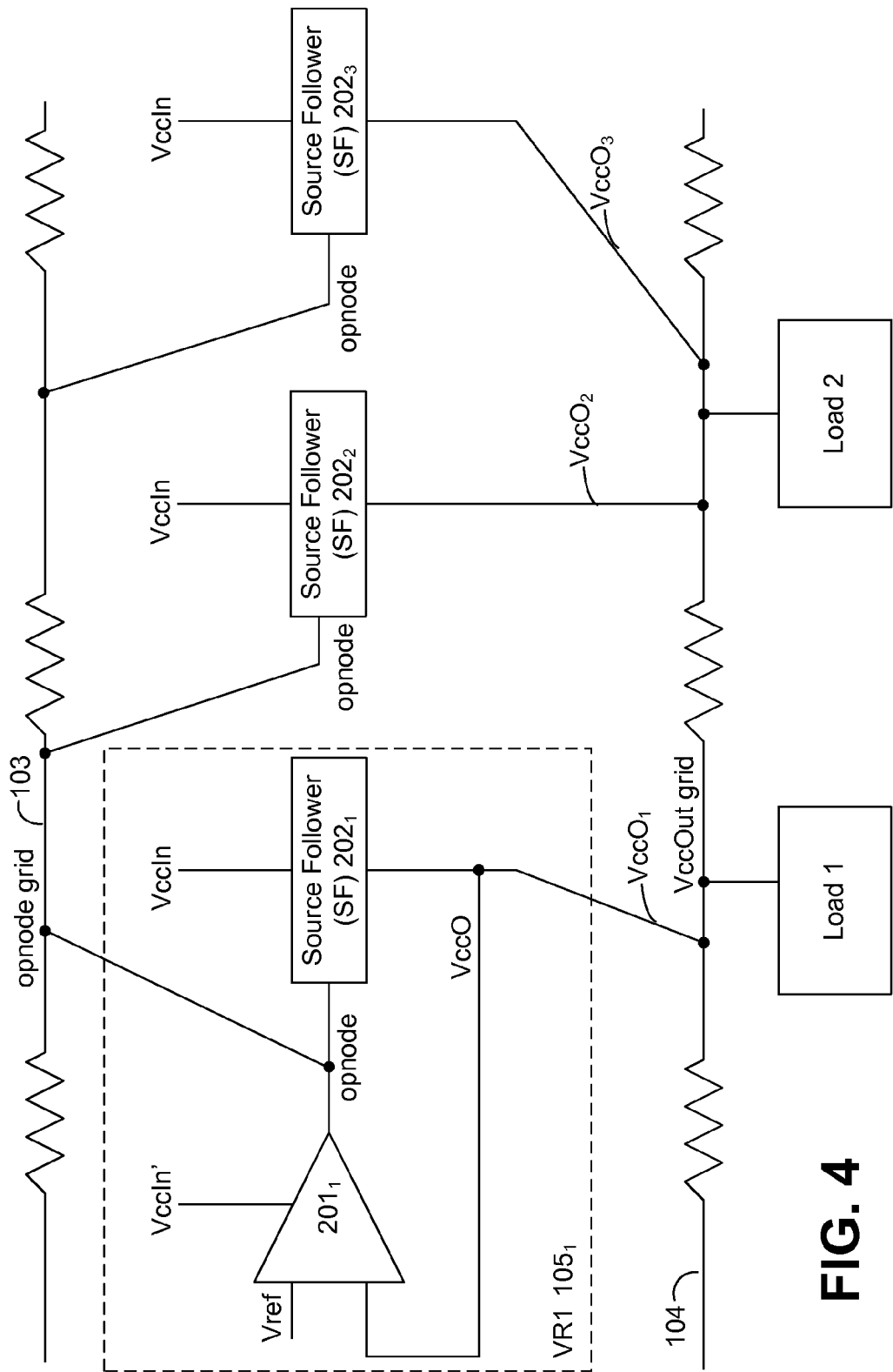
FIG. 4 is a part of the on-die grid with the VR and distributed source followers, according to one embodiment of the disclosure.

FIG. 4 is a part of the on-die grid with the VR and distributed source followers, according to one embodiment of the disclosure. So as not to obscure the embodiments of the disclosure, differences between the embodiment of FIG. 2 and FIG. 4 are discussed. In this embodiment, the opnode from VR1 $105_1$ is shared with other source followers $202_{2-N}$ (for brevity sake, only two source followers are illustrated in FIG. 4) coupled to the opnode grid 103. In this embodiment, the source follower of VR1 $105_1$ and other source followers are distributed on the opnode grid 103 and the power supply grid 104.

FIG. 5 is a VR 500 which is distributed on the on-die grid, according to one embodiment of the disclosure. In one embodiment, the VR 500 comprises an amplifier 201 and a source follower 501. In this embodiment, the source follower 501 is an n-type device MNSF with its gate terminal coupled to the output of the differential amplifier 201, its drain terminal coupled to the input power supply VccIn, and its source terminal (output node) is coupled to the power grid 104 and also as feedback to the differential amplifier 201. In one embodiment, the differential amplifier 201 operates on the same power supply as the source follower 501, i.e., VccIn power supply. In other embodiments, the amplifier 201 operates on a different power supply VccIn' than the power supply VccIn coupled to the drain terminal of the source follower 501.

While the embodiment of FIG. 5 illustrates a single n-type transistor MNSF configured as a source follower 501, multiple n-type transistors may be coupled in parallel to MNSF which are operable to receive the output of the amplifier 201 at their respective gate terminals. In one embodiment, the source follower 501 comprises p-type devices instead of n-type devices.

In one embodiment, the amplifier 201 is a single stage amplifier which is operable to drive the SF 501. In this embodiment, the output opnode of the amplifier 201 provides the dominant pole for the VR 500. The output node VccO is a low impedance node, since it is driven by the source follower 501. In this embodiment, there is a single dominant pole, set by the opnode, making the VR 500 stable.

FIG. 6 is a VR 600 with a voltage booster, according to one embodiment of the disclosure. In one embodiment, the VR 600 comprises an amplifier 201, a voltage booster 603 having an input "In" and an output "Out," and a source follower 601. In this embodiment, output 602 of the amplifier 201 is coupled to the input node "In" of the voltage booster 603. In this embodiment, output 604 of the voltage booster 603 is coupled to the gate terminal of the source follower 601. The output node 604 is functionally equivalent to the opnode of FIG. 5. In this embodiment, the drain terminal of the source follower 601 is coupled to the input power supply VccIn. In this embodiment, the source terminal VccO of the source follower 601 is coupled to the grid 104 and also provides a feedback to the amplifier 201.

Figure 8:
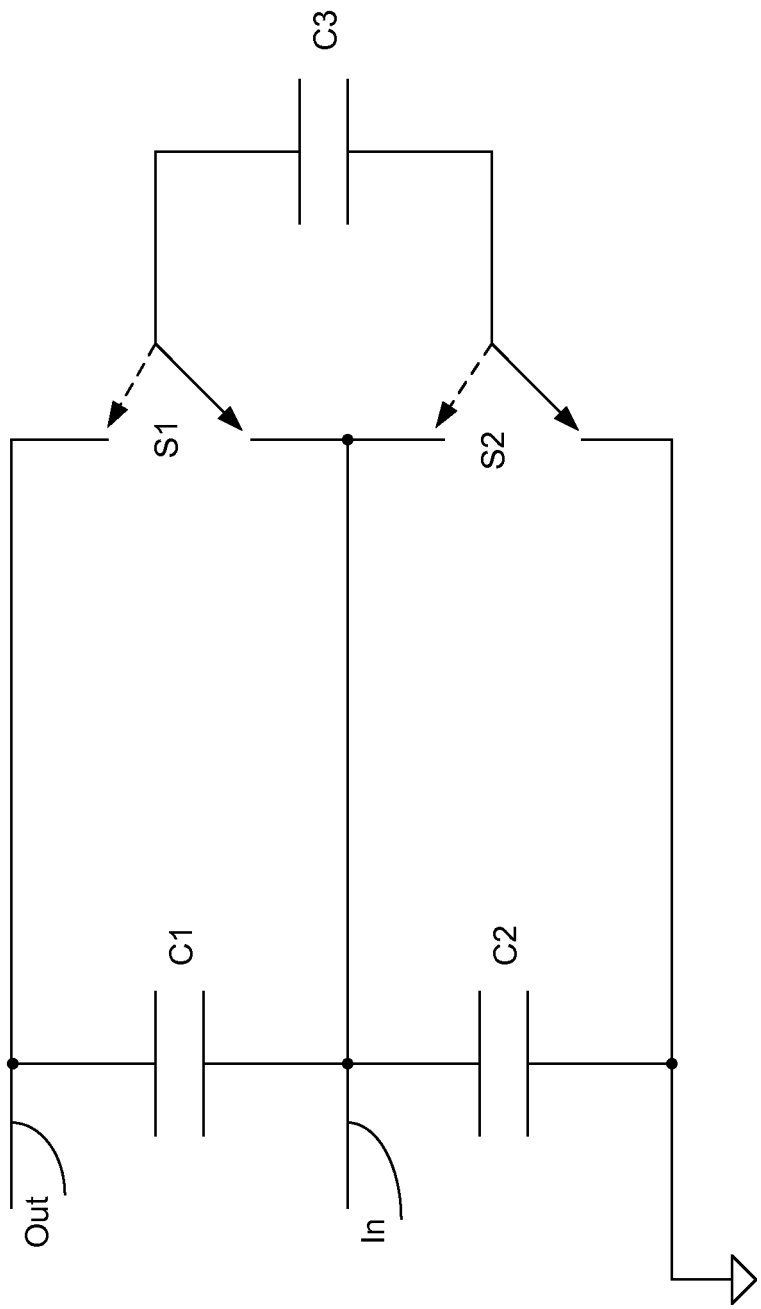
FIG. 8 is a voltage booster, according to one embodiment of the disclosure.

In one embodiment, voltage booster 603 is a voltage doubler as illustrated in FIG. 8. Referring back to FIG. 6, in one embodiment the voltage booster 603 is a voltage tripler. In another embodiment, the voltage booster 603 is a charge pump providing any ratio of voltage i.e., ratio of output voltage on node 604 over input voltage on node 602. In one embodiment, the voltage booster may be any circuit which allows the voltage on the node 604, coupled to the gate of the source follower 601, to be higher in voltage level than the supply voltage VccIn coupled to the drain terminal of the source follower 601. In one embodiment, the voltage booster 603 receives the same power supply as the source follower 601 i.e., power supply VccIn.

In one embodiment, by boosting the voltage of node 604 relative to the power supply VccIn, the VR 600 behaves like a low dropout voltage regulator (LDOVR). Such LDOVR provides higher efficiency than the VR 500 of FIG. 5. By boosting (i.e., raising) the gate voltage above the drain voltage the NMOS source follower 601 is biased with a drain to source voltage (Vds) that is lower than the threshold voltage of the transistor MNSF. This creates a low dropout regulator (LDO). In one embodiment, when the gate voltage cannot be driven above the drain voltage, then the highest voltage that the LVR 600 can deliver is the drain voltage minus the threshold of the output transistor MNSF.

Figure 7:
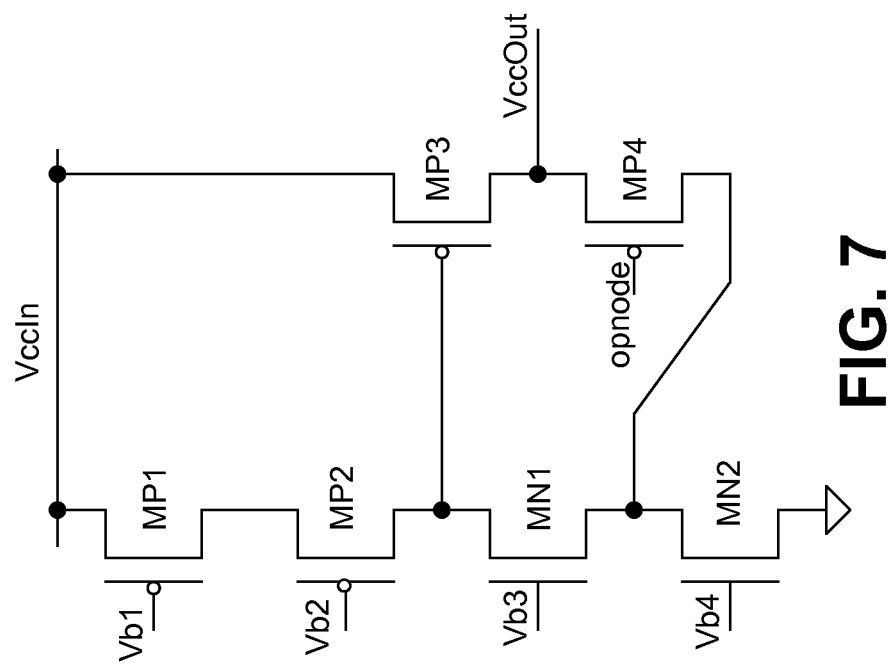
FIG. 7 is a source follower, according to one embodiment of the disclosure.

FIG. 7 is a source follower 700, according to one embodiment of the disclosure. In one embodiment, the source follower comprises p-type transistors MP3 and MP4. In this embodiment, the p-type transistor MP3 receives a bias voltage at its gate terminal, receives power supply VccIn at its source terminal, and is coupled to the output node VccOut at its drain terminal. In one embodiment, the p-type transistor MP4 receives the opnode from the amplifier 201 at its gate terminal. In this embodiment, the source terminal of the p-type transistor MP4 is coupled to the output node VccOut. In one embodiment, the drain terminal of p-type transistor MP4 is biased at bias level above ground.

In one embodiment, a bias network of transistors is operable to provide bias voltage to the gate of p-type transistor MP3 and the drain terminal of p-type transistor MP4. In one embodiment, the bias network comprises a p-type transistor MP1, p-type transistors MP2, n-type transistor MN1, and n-type transistor MN2. In one embodiment, MP1 is coupled in series with MP2, MP2 is coupled in series with MN1, and MN1 is coupled in series with MN2. In this embodiment, common coupling terminal of MN1 and MN2 i.e., source terminal of MN1 and drain terminal of MN2, provide the bias voltage to the drain terminal of MP4. In this embodiment, the common coupling terminal of MP1 and MN1 i.e., drain terminal of MP2 and drain terminal of MN1 provides the bias voltage to the gate terminal of MP3.

In one embodiment, the gate terminals of MP1, MP2, MN1, and MN2 are biased by bias voltages Vb1, Vb2, Vb3, and Vb4 respectively. In one embodiment, Vb1, Vb2, Vb3, and Vb4 are generated from a bias generator (not shown) comprising a bandgap circuit. In another embodiment, Vb1, Vb2, Vb3, and Vb4 are generated from a voltage divider circuit e.g., a resistor divider. In other embodiments, other forms of reference voltage generators may be used. In one embodiment, the bias generator is positioned close to the VR having the source follower 700. In other embodiments, the bias generator is shared between multiple VRs. In another embodiment, a single bias generator may be used for providing bias voltages to multiple source followers. Any combination of the above locations and usage models of the bias generator is contemplated herein.

FIG. 8 is a voltage booster 800, according to one embodiment of the disclosure. In this embodiment, the voltage booster 800 is a voltage doubler which doubles the input voltage "In" at the output node "Out." In one embodiment, the node "Out" is coupled to the gate of the source follower while the node "In" is coupled to the output of the amplifier 201.

In one embodiment, the voltage doubler is a switch capacitor based circuit comprising capacitors C1, C2, and C3. The capacitor C3 is also referred herein as a "flying" capacitor because it is constantly being "moved" up and down so that it is either parallel to capacitor C1 or parallel to capacitor C2 as the switches S1 and S2 electrically switch. In one embodiment, the frequency of switching of the switches S1 and S2 is in the range of few Megahertz to 1 GHz. In other embodiments, other frequency ranges may be used. In one embodiment, the switches S1 and S2 are controlled by a non-overlapping clock generator.

In one embodiment, capacitors C1 and C2 are of same size while capacitor C3 is of different size (in term of capacitance). In other embodiments, capacitors C1, C2, and C3 are of different capacitances. In one embodiment, the voltage doubler 800 comprises switches S1 and S2 coupling the terminals of C3 with terminals of C1 and C2. In one embodiment, the switches S1 and S2 are implemented as transistors. In one embodiment, the capacitors C1, C2, and C3 are metal capacitors. In other embodiments, the capacitors C1, C2, and C3 are implemented as transistors. In another embodiment, a combination of metal capacitor and transistors configured together as capacitors are used to implement capacitors C1, C2 and C3.

In one embodiment, the voltage doubler 800 may also be configured to operate as a voltage divider instead of a voltage doubler. In such an embodiment, the nodes "In" and "Out" are functionally switched such that an input voltage is applied to the node labeled as "Out" in FIG. 8 which receives an input voltage while the divided voltage is received at the node labeled "In." This dual behavior of the circuit 800 allows the circuit 800 to be used as a voltage doubler and a voltage divider in various embodiments herein.

Figure 9:
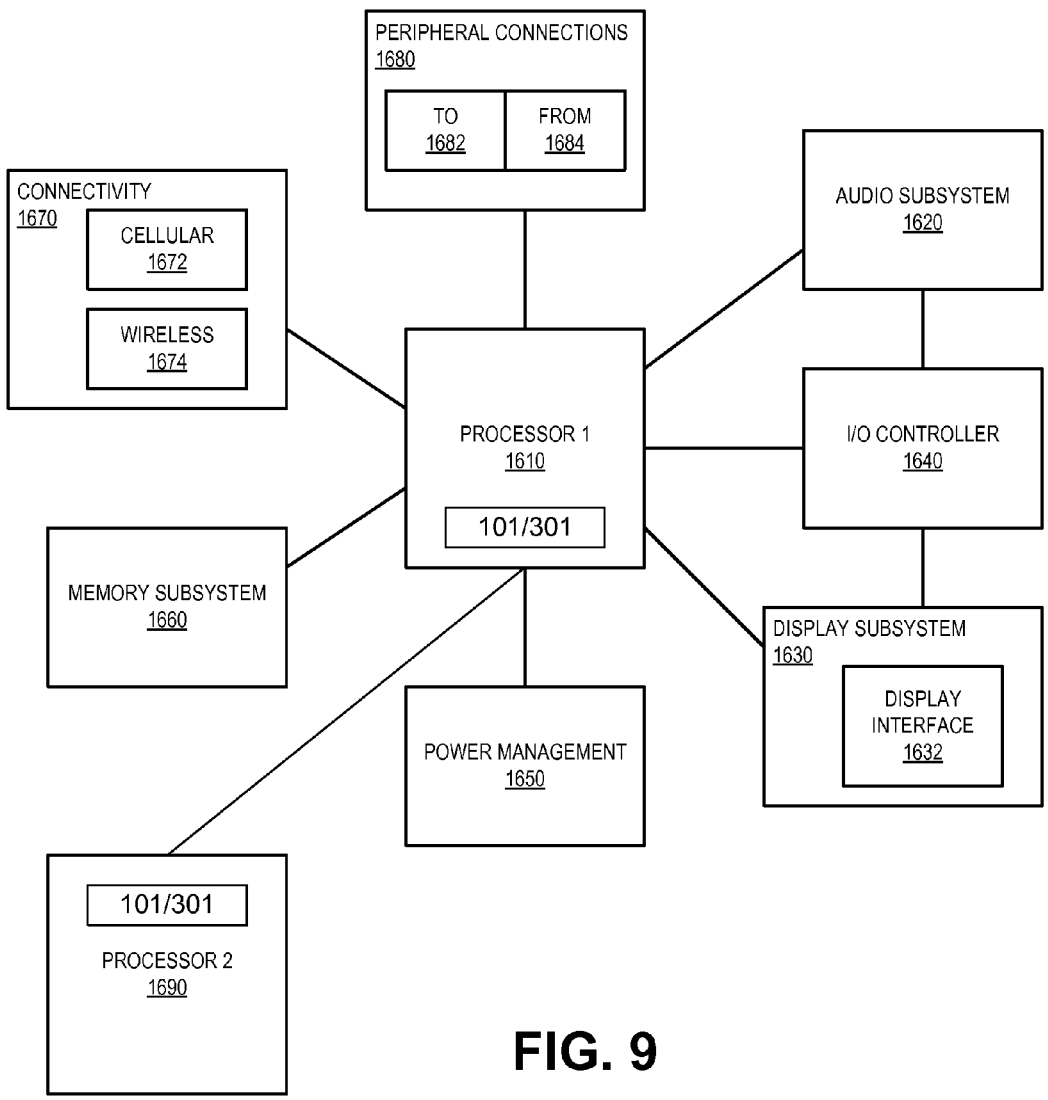
FIG. 9 is a system-level diagram of a smart device comprising a processor with the VRs distributed on an on-die grid, according to one embodiment of the disclosure.

FIG. 9 is a system-level diagram 1600 of a smart device comprising a processor with the VRs and/or source followers distributed on an on-die grid, according to one embodiment of the disclosure. FIG. 9 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, the computing device 1600 includes a first processor 1610 with the distributed LVR network 101/301 and a second processor 1690 with the distributed LVR network 101/301, according to the embodiments discussed herein. The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an integrated circuit comprises: a first voltage regulator comprising a first node coupled to a gate of a first source follower; and a second node coupled to a gate of a second source follower, wherein the first and second nodes are electrically shorted. In one embodiment, the second node is part of a second voltage regulator different from the first voltage regulator. In one embodiment, the first and second voltage regulators are linear voltage regulators. In one embodiment, the first and second voltage regulators comprise corresponding first and second differential amplifiers having respective outputs to drive corresponding first and second source followers.

In one embodiment, the first voltage regulator comprises a voltage booster coupled between a differential amplifier and the first source follower, the voltage booster to generate an output voltage higher than an input voltage. In one embodiment, the first node is an output of the voltage booster. In one embodiment, the voltage booster comprises a switch capacitor circuit. In one embodiment, the voltage booster comprises a voltage doubler.

In one embodiment, the first and second source followers provide power supply to one or more loads. In one embodiment, the first and second source followers comprise corresponding first and second source/drain terminals coupled to a first power supply. In one embodiment, the first voltage regulator comprises a first differential amplifier operating on a power supply different from the first power supply. In one embodiment, the first voltage regulator comprises a first differential amplifier operating on the first power supply.

In another example, an integrated circuit comprises: a first voltage regulator comprising a first source follower having a first node to provide a first power supply, and a second node different from the first node; and a second voltage regulator comprising a second source follower having a first node to provide a second power supply, and a second node different from the first node, wherein the second nodes of the first and second voltage regulators are electrically shorted.

In one embodiment, the first nodes of the first and second voltage regulators are coupled to a power grid to supply power to one or more loads. In one embodiment, the second node of the first voltage regulator is coupled to a gate of the first source follower, and wherein the second node of the second source follower is coupled to a gate of the second source follower. In one embodiment, the first voltage regulator comprises a voltage booster coupled between a first differential amplifier of the first voltage regulator and the first source follower.

In another example, a system comprises a power supply unit; and a processor operable to receive a first power supply from the power supply unit, the processor according to the integrated circuit discussed herein. In one embodiment, the power supply unit is a battery. In one embodiment, the system further comprises a display unit. In one embodiment, the display is a touch screen. In one embodiment, the system further comprises a wireless interface to communicatively couple the processor with another device.

In another example, the integrated circuit comprises a first voltage regulator including: a first differential amplifier; a voltage booster coupled to the first differential amplifier, the voltage booster to generate a boosted voltage at a first node; and a first source follower coupled to the first node. In one embodiment, the integrated circuit further comprises a second node coupled to a gate of a second source follower, wherein the first and second nodes are electrically shorted. In one embodiment, the second node is part of a second voltage regulator different from the first voltage regulator. In one embodiment, the voltage booster comprises a voltage doubler.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit on a single die comprising:
a first voltage regulator, on the single die, comprising a first amplifier having an output node coupled to a gate of a first source follower;
a second voltage regulator, on the single die, comprising a second amplifier having an output node coupled to a gate of a second source follower, wherein the first and second output nodes are electrically shorted, and wherein, the respective output terminals of the first source follower and the second source follower are electrically coupled by a wire but electrically separated by a resistance along the wire so as to permit a voltage difference between the respective output terminals;
a first load, on the single die, proximately coupled to the output terminal of the first source follower; and
a second load, on the single die, proximately coupled to the output terminal of the second source follower such that the resistance is substantially greater than a first wiring resistance between the first load and the output terminal of the first source follower and is substantially greater than a second wiring resistance between the second load and the output terminal of the second source follower.

2. The integrated circuit of claim 1, wherein the first and second voltage regulators are linear voltage regulators.

3. The integrated circuit of claim 1, wherein the respective amplifiers of the first and second voltage regulators are implemented with first and second differential amplifiers respectively, and wherein the first and second differential amplifiers include respective outputs to drive the corresponding first and second source followers.

4. The integrated circuit of claim 1, wherein the first voltage regulator comprises a voltage booster coupled between the first amplifier and the first source follower, the voltage booster to generate an output voltage higher than an input voltage.

5. The integrated circuit of claim 4, wherein the voltage booster comprises a switch capacitor circuit.

6. The integrated circuit of claim 4, wherein the voltage booster comprises a voltage doubler.

7. The integrated circuit of claim 1, wherein the first and second source followers comprise corresponding other respective terminals coupled to a first power supply.

8. The integrated circuit of claim 7, wherein the first voltage regulator comprises a first differential amplifier operating on a power supply different from the first power supply.

9. The integrated circuit of claim 7, wherein the first voltage regulator comprises a first differential amplifier operating on the first power supply.

10. An integrated circuit on a single die comprising:
a first voltage regulator, on the single die, comprising a first source follower having a first node to provide a first power supply for a first load on the single die, and, a second node between the first node and a first amplifier output; and
a second voltage regulator, on the single die, comprising a second source follower having a first node to provide a second power supply for a second load on the single die, and a second node between the first node and a second amplifier output, wherein the first nodes of the first and second voltage regulators are electrically coupled by a wire but electrically separated by a resistance along the wire so as to permit a voltage difference between the respective output terminals, wherein the second nodes of the first and second voltage regulators are electrically shorted, wherein the first load is proximately coupled to the first node of the first source follower and the second load is proximately coupled to the first node of the second source follower such that the resistance is substantially greater than a first wiring resistance between the first load and the first node of the first source follower and is substantially greater than a second wiring resistance between the second load and the first node of the second source follower.

11. The integrated circuit of claim 10, wherein the second node of the first voltage regulator is coupled to a gate of the first source follower, and wherein the second node of the second source follower is coupled to a gate of the second source follower.

12. The integrated circuit of claim 10, wherein the first amplifier of the first voltage regulator is a first differential amplifier, and wherein the first voltage regulator comprises a voltage booster coupled between the first differential amplifier and the first source follower.

13. A system comprising:
a power supply unit;
a memory;
a processor, coupled to the memory, and operable to receive a first power supply from the power supply unit, the processor comprising:
a first voltage regulator, on a single die, comprising a first amplifier having an output node coupled to a gate of a first source follower; a second voltage regulator comprising a second amplifier having an output node coupled to a gate of a second source follower, wherein the first and second output nodes are electrically shorted, and wherein, the output terminals of the first source follower and the second source follower are electrically coupled by a wire but electrically separated by a resistance along the wire so as to permit a voltage difference between the respective output terminals;
a first load, on the single die, proximately coupled to the output terminal of the first source follower; and,
a second load, on the single die, proximately coupled to the output terminal of the second source follower such that the resistance is substantially greater than a first wiring resistance between the first load and the output terminal of the first source follower and is substantially greater than a second wiring resistance between the second load and the output terminal of the second source follower; and
a wireless interface to communicatively couple the processor with another device.

14. The system of claim 13, wherein the power supply unit is a battery.

15. The system of claim 13 further comprises a display unit to display content processed by the processor.

* * * * *